(12) United States Patent
Linnenbrink (10) Patent No.: US 10,665,941 B2
(45) Date of Patent: May 26, 2020

(54) ACTIVE, ELECTRONICALLY SCANNED ARRAY ANTENNA

(71) Applicant: Teqnovations, LLC, Colorado Springs, CO (US)

(72) Inventor: Thomas Edward Linnenbrink, Colorado Springs, CO (US)

(73) Assignee: Teqnovations, LLC, Colorado Springs, CO (US)

(*) Notice: Subject to any disclaimer, the term of this patent is extended or adjusted under 35 U.S.C. 154(b) by 92 days.

(21) Appl. No.: 16/106,865

(22) Filed: Aug. 21, 2018

(65) Prior Publication Data

US 2019/0013581 A1 Jan. 10, 2019

Related U.S. Application Data

(63) Continuation-in-part of application No. 15/139,026, filed on Apr. 26, 2016, now Pat. No. 10,074,902, (Continued)

(51) Int. Cl.
*H01Q 3/26* (2006.01)
*H01Q 3/30* (2006.01)
(Continued)

(52) U.S. Cl.
CPC ............ *H01Q 3/2682* (2013.01); *H01P 9/00* (2013.01); *H01P 9/003* (2013.01); *H01Q 3/30* (2013.01); *H01Q 3/40* (2013.01); *H03K 5/06* (2013.01)

(58) Field of Classification Search
CPC .......... H01Q 3/30; H01Q 3/40; H01Q 3/2682; H01Q 3/3676; H01Q 3/26; H01Q 3/32;
(Continued)

(56) References Cited

U.S. PATENT DOCUMENTS 3,266,010 A 8/1966 Brightman et al.
3,970,790 A 7/1976 Guanella
(Continued)

FOREIGN PATENT DOCUMENTS

CN 101073179 A 11/2007
JP S61-186001 A 8/1986
(Continued)

OTHER PUBLICATIONS

Office Action with list of references from corresponding JP patent application 2016-500751 dated Jan. 25, 2019.
(Continued)

*Primary Examiner* — Harry K Liu
(74) *Attorney, Agent, or Firm* — Husch Blackwell LLP (57) ABSTRACT

A transmission line is provided with a fixed physical length and a programmable electrical length for achieving a programmable time delay. The transmission line can include a dielectric and a biasing device disposed across the dielectric, and the biasing device can dynamically and continuously vary an absolute level of a bias voltage across the dielectric to vary a dielectric constant of the dielectric, which can vary a time delay of the transmission line. In some embodiments, the biasing device can modulate the bias voltage from a positive voltage to a negative voltage at a frequency and with waveform characteristics that prevent such modulation from interfering with a signal propagating through the dielectric, that prevent the bias voltage from unintentionally varying the time delay of the transmission line when the absolute level of the bias voltage is constant, and that prevents ion impurities within the dielectric from accumulating on bias electrodes.

20 Claims, 4 Drawing Sheets

Related U.S. Application Data which is a continuation of application No. 13/842,251, filed on Mar. 15, 2013, now Pat. No. 9,350,074.

(51) Int. Cl.

| | |
|---|---|
| *H03K 5/06* | (2006.01) |
| *H01P 9/00* | (2006.01) |
| *H01Q 3/40* | (2006.01) |

(58) Field of Classification Search
CPC .. H01Q 3/22; H01P 9/00; H01P 9/003; H03K 5/06
USPC .......................................................... 342/375
See application file for complete search history.

(56) References Cited

U.S. PATENT DOCUMENTS

| | | | |
|---|---|---|---|
| 4,799,034 | A | 1/1989 | Silverman et al. |
| 4,912,478 | A | 3/1990 | Daniel |
| 5,130,717 | A | 7/1992 | Ewen et al. |
| 5,140,333 | A | 8/1992 | Parker |
| 5,260,711 | A | 11/1993 | Sterzer |
| 5,648,787 | A | 7/1997 | Ogot et al. |
| 5,694,134 | A | 12/1997 | Barnes |
| 5,894,288 | A | 4/1999 | Lee et al. |
| 6,191,735 | B1 | 2/2001 | Schineller |
| 6,393,177 | B2 | 5/2002 | Paek |
| 6,556,102 | B1 | 4/2003 | Sengupta et al. |
| 6,590,531 | B2 | 7/2003 | McKinzie, III et al. |
| 6,701,141 | B2 | 3/2004 | Lam |
| 7,030,824 | B1 | 4/2006 | Taft et al. |
| 7,209,079 | B2 | 4/2007 | Easton |
| 7,884,766 | B2 | 2/2011 | Haziza |
| 2003/0016097 | A1 | 1/2003 | McKinzie, III et al. |
| 2004/0041664 | A1 | 3/2004 | Takasu |
| 2005/0190104 | A1 | 9/2005 | Coleman et al. |
| 2006/0267558 | A1 | 11/2006 | Petz et al. |
| 2007/0040628 | A1 | 2/2007 | Kanno et al. |
| 2008/0303742 | A1 | 12/2008 | Dybdal et al. |
| 2009/0073332 | A1 | 3/2009 | Irie |
| 2010/0321060 | A1 | 12/2010 | Nishio et al. |
| 2011/0084880 | A1 | 4/2011 | Sakai et al. |
| 2011/0237950 | A1 | 9/2011 | Meng |
| 2012/0281502 | A1 | 11/2012 | Tsushima et al. |
| 2012/0286983 | A1 | 11/2012 | Pfann et al. |
| 2014/0232598 | A1* | 8/2014 | Dai .......................... H01Q 3/34 342/372 |

FOREIGN PATENT DOCUMENTS

| | | |
|---|---|---|
| JP | H11-103201 A | 4/1999 |
| JP | H11103201 A | 4/1999 |
| JP | 2010-509823 A | 3/2010 |
| TW | M505712 U | 7/2015 |
| TW | M505713 U | 7/2015 |

OTHER PUBLICATIONS

English-language translation of Office Action with list of references from corresponding JP patent application 2016-500751 dated Jan. 25, 2019.
English-language translation of abstract for JP patent publication S61-186001 dated Aug. 19, 1986.
English-language translation of abstract for JP patent publication H11-103201 dated Apr. 13, 1999.
Certificate of Correction for U.S. Pat. No. 5,894,288 dated Jan. 25, 2000.
Certificate of Correction for U.S. Pat. No. 6,590,531 B2 dated Jun. 29, 2004.
English language translation of bibliographic data and abstract for CN101073179 (A).
English language translation of bibliographic data for JP2010509823 (A) and English langauge translation of abstract for corresponding document WO2008056127 (A1).
Office Action from corresponding JP Patent Application 2016-500751, dated Feb. 28, 2018.
English language translation of Office Action from corresponding JP Patent Application 2016-500751, dated Feb. 28, 2018.
PCT International Search Report, dated Sep. 10, 2014, for corresponding International Application No. PCT/US2014/021325.
PCT Written Opinion of the International Searching Authority, dated Sep. 10, 2014, for corresponding International Application No. PCT/US2014/021325.
PCT Notification Concerning Transmittal of International Preliminary Report on Patentability, dated Sep. 24, 2015, for corresponding International Application No. PCT/US2014/021325.
Extended European Search Report, dated Oct. 14, 2016, corresponding to Application No. EP 14 77 1019.
Nabeel A. Riza, Liquid Crystal-Based Optical Time Delay Units for Phased Array Antennas, Journal of Lightwave Technology, vol. 12, No. 8, Aug. 1994, pp. 1440-1447.
Nabeel A. Riza et al., Characterization of a Ferroelectric Liquid Crystal-Based Time Delay Unit for Phased Array Antenna Applications, Journal of Lightwave Technology, vol. 15, No. 7, Jul. 1997, pp. 1088-1094.
Takao Kuki et al., Microwave Variable Delay Line Using Dual-Frequency Switching-Mode Liquid Crystal, IEEE Transactions on Microwave Theory and Techniques, vol. 50, No. 11, Nov. 2002, pp. 2604-2609.
A. Gaebler et al., Liquid Crystal-Reconfigurable Antenna Concepts for Space Applications at Microwave and Millimeter Waves, International Journal of Antennas and Propagation, vol. 2009, Article ID 876989.
Onur Hamza Karabey et al., A 2-D Electronically Steered Phased-Array Antenna With 2 x 2 Elements in LC Display Technology, IEEE Transactions on Microwave Theory and Techniques, vol. 60, No. 5, May 2012, pp. 1297-1306.
Yu Garbovskiy et al., Liquid crystal phase shifters at millimeter wave frequencies, Journal of Applied Physics, Citation: J. Appl. Phys. 111, 054504 (2012); doi: 10.1063/1.3691202.
Stripline Impedance | Electrical Engineering Tools | EEWeb EE Web, Electrical Engineering Community, Stripline Impedance—PCB Symmetric Stripline Impedance Calculator, Feb. 15, 2013 www.eeweb.com/toolbox/symmetric-stripline-impedance.
Sebastian Strunck et al., "Continuously Tunable Phase Shifters for Phased Arrays based on Liquid Crystal Technology." Institut (sic) for Microwave Engineering and Photonics, Darmstadt, Germany, pp. 82-88, © 2013 IEEE.
Wulf-Dieter Wirth, Radar techniques using array antennas, The Institution of Electrical Engineers, various pages of Chapter 4—Array antennas (not dated).
Office Action and Search Report from corresponding TW patent application 103108878, dated Oct. 3, 2019.
English language translation of the Office Action and Search Report from corresponding TW patent application 103108878, dated Oct. 3, 2019.
English language translation of TW patent publication M505713 U, dated Jul. 21, 2015.
English language translation of TW patent publication M505712 U, dated Jul. 21, 2015.
Office Action and Search Report from corresponding TW patent application 103108878, dated Jul. 3, 2018.
English language translation of the Office Action and Search Report from corresponding TW patent application 103108878, dated Jul. 3, 2018.
Examination report from corresponding EP patent application 14 771 019.8, dated May 16, 2019.
Mueller et al., "Tunable Passive Phase Shifter for Microwave Applications using Highly Anisotropic Liquid Crystals", Microwave Symposium Digest, 2004 IEEE MTT-S, International Fort Worth, TX, USA Jun. 6-11, 2004, Piscataway, NJ, USA, IEEE, vol. 2, pp. 1151-1154, dated Jun. 6, 2004.
Fourth Office Action from corresponding CN patent application 201480027641.4, dated Apr. 12, 2019.

(56) References Cited

OTHER PUBLICATIONS

English-language translation of Fourth Office Action from corresponding CN patent application 201480027641.4, dated Apr. 12, 2019.
English-language translation of JP patent publication H11103201, dated Apr. 13, 1999.

* cited by examiner

IN-LINE, TWO-DIMENSIONAL BEAM FORMER (LEVEL 1)

BINARY, SWITCHED TIME DELAY, OR TROMBONE LINE
$T = 3T_P + 3T_L + (0:7\Delta t)$

FIG. 3

CONTINUOUS, VOLTAGE-VARIABLE TIME DELAY WITH 3-BIT DIGITAL CONTROL
$T = T_{min} + (0:7\Delta t)$

ACTIVE, ELECTRONICALLY SCANNED ARRAY ANTENNA

CROSS-REFERENCE TO RELATED APPLICATIONS

This application is a continuation-in-part of and claims the benefit of the filing date of U.S. application Ser. No. 15/139,026 filed Apr. 26, 2016, which is a continuation of and claims the benefit of the filing date of U.S. application Ser. No. 13/842,251 filed Mar. 15, 2013, now U.S. Pat. No. 9,350,074.

FIELD

The present invention relates generally to antennas. More particularly, the present invention relates to an active, electronically scanned array ("ESA") antenna.

BACKGROUND

Phase shifters are widely known, made, and used. For example, many known ESA antennas employ programmable phase shifters to form phased arrays. While phased arrays provide many advantages, they also include various disadvantages.

Time delays are known in the art, but array antennas that employ time delays in lieu of phase delays have been difficult to achieve. Accordingly, there is a continuing, ongoing need for an ESA antenna that employs programmable time delays to form timed arrays as opposed to phase arrays.

DETAILED DESCRIPTION

While this invention is susceptible of an embodiment in many different forms, there are shown in the drawings and will be described herein in detail specific embodiments thereof with the understanding that the present disclosure is to be considered as an exemplification of the principles of the invention. It is not intended to limit the invention to the specific illustrated embodiments.

Embodiments disclosed herein include an ESA antenna that employs programmable time delays in transmission lines to form timed arrays. That is, in some embodiments disclosed herein, programmable phase shifters and phased arrays are not employed, and antenna beam direction can be maintained independently of frequency. Accordingly and advantageously, the antenna and/or an array in accordance with disclosed embodiments can be both light and cost effective.

According to disclosed embodiments, a programmable time delay can be realized as and/or in a transmission line with a fixed physical length and with a programmable electrical length. That is, the transmission line can carry a radio frequency (RF) signal and can also time-delay the signal, as necessary. Accordingly, the transmission line can include the programmable time delay.

In some embodiments, the transmission line disclosed herein does not require an active component, such as a low-noise amplifier, in the RF signal path to buffer a high insertion loss. However, in some embodiments, one or more active components can be located in the RF signal path.

The antenna in accordance with disclosed embodiments can transmit and/or receive signals. Accordingly, the antenna in accordance with disclosed embodiments can time-delay the signals transmitted and/or received. Furthermore, the antenna in accordance with disclosed embodiments can process a single signal beam or multiple signal beams. When time-delaying multiple beams, the beams can be processed completely or partially independently.

The antenna in accordance with disclosed embodiments can be formed from one or more arrays and/or sub-arrays. For example, the array or a sub-array can be coupled together as would be known and desired by one of ordinary skill in the art to form the antenna. Furthermore, the antenna, the array, and/or the sub-array in accordance with disclosed embodiments can be any size or shape as would be known and desired by one of ordinary skill in the art and is not limited by the embodiments specifically disclosed herein. For example, the array or the sub-array can include a linear array or an area array.

In some embodiments, the array or the sub-array can be implemented as a nested set of transmission lines and can include any number of nested levels as would be known and desired by one of ordinary skill in the art. For example, the array can include one, two, three, or N number of the nested levels, and the signals in the array or the sub-array can be summed or divided in a nested manner, that is, within each of the nested levels.

In receiving embodiments, the antenna, the array, and/or the sub-array can receive the signal, for example, a wave front, traveling in free space. However, a first element in the antenna, the array, or the sub-array may receive the wave front before a second element in the antenna, the array, or the sub-array, for example, if the wave front is disposed at an angle relative to the antenna, the array, and/or the sub-array. To account for such a delay in receiving the signal, the antenna, the array, and/or the sub-array disclosed herein can have a combined effect of producing the time delay that is equivalent to the delay of the wave front traveling in free space. For example, the antenna, the array, and/or the sub-array in accordance with disclosed embodiments can produce a range of time delays from 0 to $\Delta t$, where $\Delta t$ is equivalent to the time it takes for the wave front to travel in free space the longest distance between receiving elements in the antenna, the array, and/or the sub-array. In some embodiments, the range of time delays that can be produced is continuous. However, in some embodiments, the range of time delays that can be produced is controlled digitally, which can result in discrete increments of time.

Figure 1:
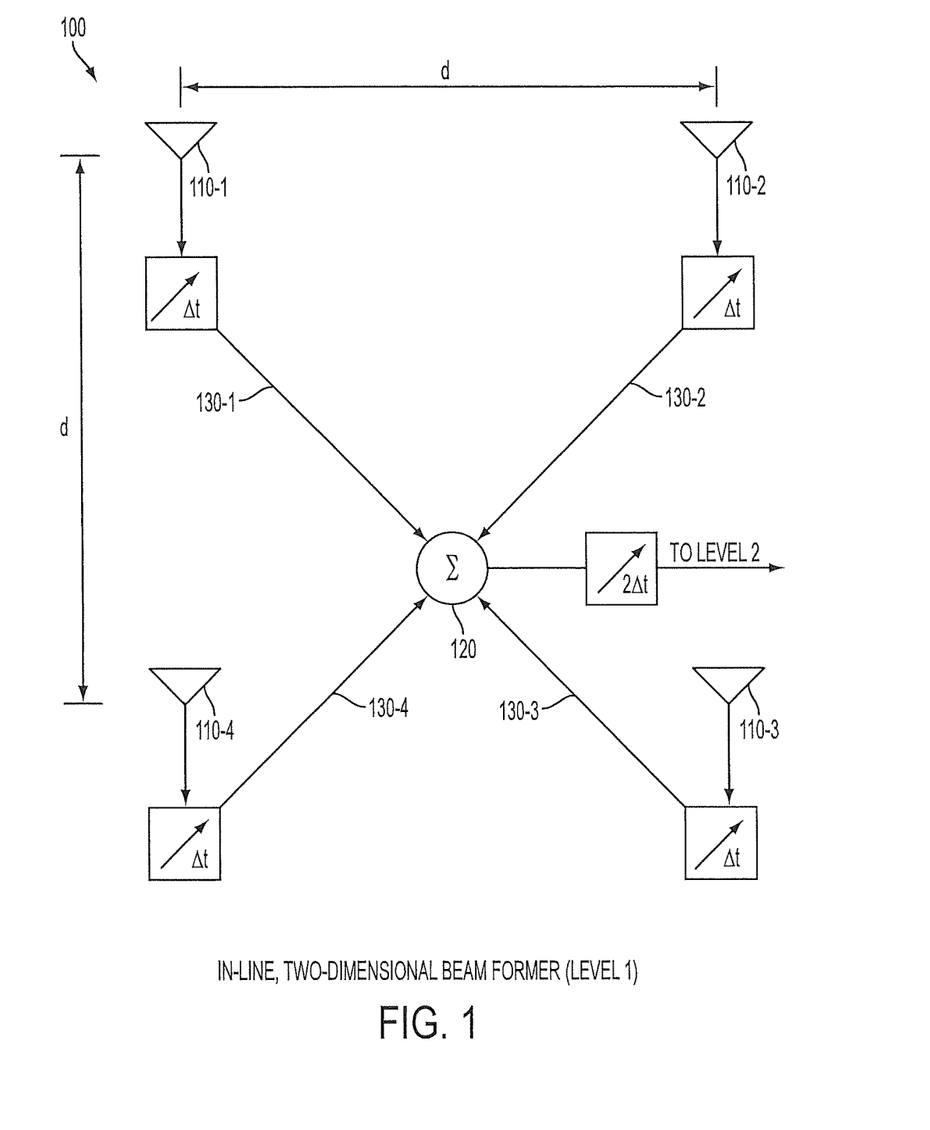
FIG. 1 is a block diagram of a one-level two-dimensional beam former in accordance with disclosed embodiments.
Figure 2:
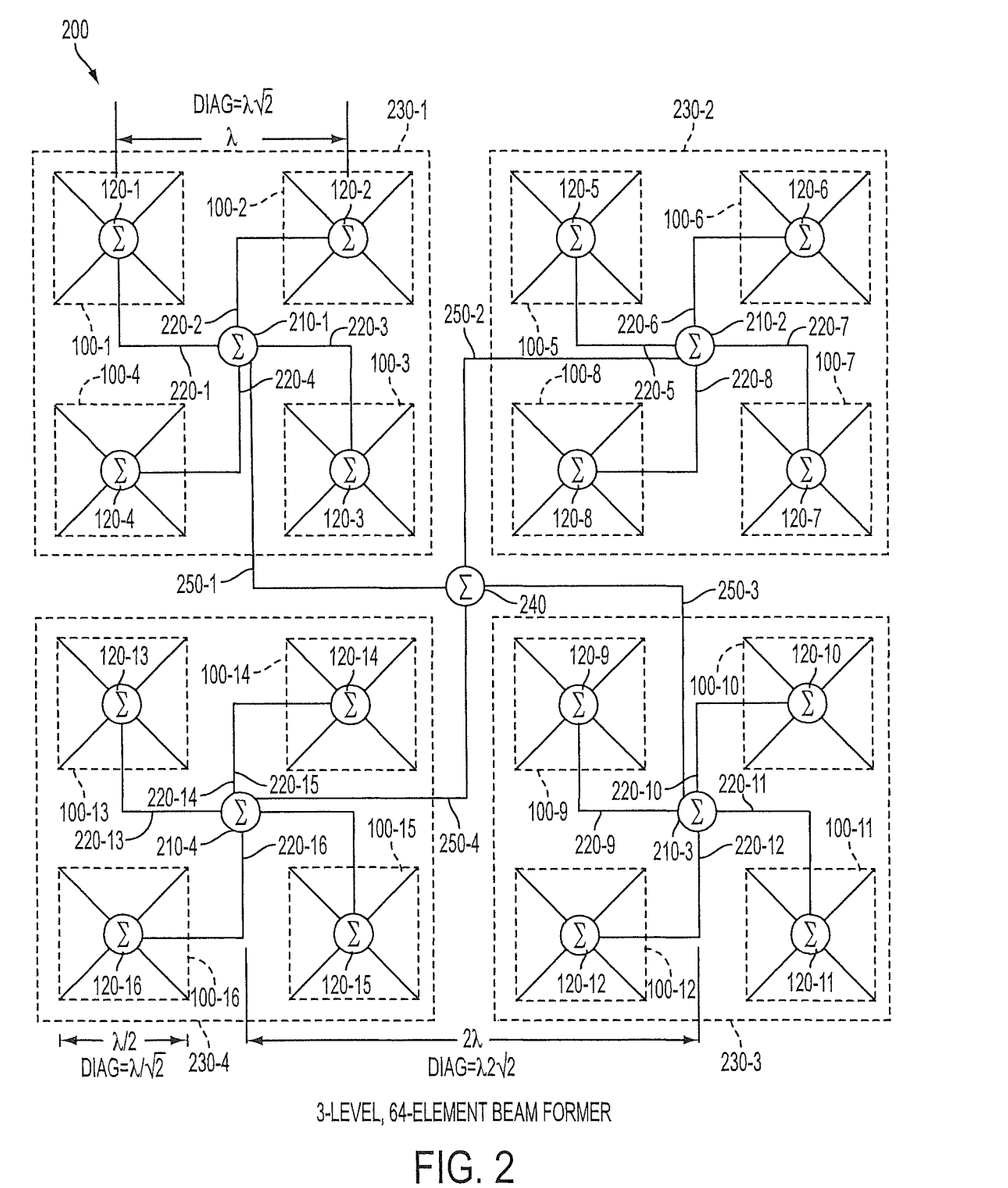
FIG. 2 is a block diagram of a three-level two-dimensional beam former in accordance with disclosed embodiments.

In accordance with the above, FIG. 1 is a block diagram of an exemplary one-level two-dimensional beam former 100 in accordance with disclosed embodiments, and FIG. 2 is a block diagram of an exemplary three-level two-dimensional beam former 200 in accordance with disclosed embodiments. The antenna elements and the nested levels shown in FIG. 1 and FIG. 2 are on a square grid. However, it is to be understood that embodiments disclosed herein are not so limited. For example, the antenna elements and/or the nested levels in accordance with disclosed embodiments can be arranged on any uniform or non-uniform grid as would be known and desired by one of ordinary skill in the art, for example, a rectangular or triangular grid or on a sparse array or sub-array in which the antenna elements are not next to each other.

As seen in FIG. 1, a transmission line can physically span the distance between and connect a summing node and an antenna element. For example, antenna elements 110-1, 110-2, 110-3, 110-4 can be connected to a summing node 120 by respective transmission lines 130-1, 130-2, 130-3, 130-4. That is, the transmission line 130-1 can connect the antenna element 110-1 to the summing node 120, the transmission line 130-2 can connect the antenna element 110-2 to the summing none 120, the transmission line 130-3 can connect the antenna element 110-3 to the summing node 120, and the transmission line 130-4 can connect antenna element 110-4 to the summing node 120.

Although FIG. 1 and FIG. 2 illustrate four transmission lines coupled to each summing node illustrated, it is to be understood that embodiments disclosed herein are not so limited. For example, two, three, or N number of transmission lines can be coupled to each summing node, and the summing nodes can sum signals received via the transmission lines coupled thereto.

The physical length of each of the transmission lines 130-1, 130-2, 130-3, 130-3, 130-4 can be fixed, but the electrical length of each of the transmission lines 130-1, 130-2, 130-3, 130-4 can be programmable and variable. Accordingly, the electrical length of each of the transmission lines 130-1, 130-2, 130-3, 130-4 can provide a range of delay times that spans the time it takes a signal to travel between the antenna elements 110-1, 110-2, 110-3, 110-4 in free space, for example, in air or in a vacuum. In some embodiments, the smallest delay time can include a variable time delay programmable to 0, but still include a fixed delay that is attributable to the physical path length of one of the transmission lines 130-1, 130-2, 130-3, 130-4. In some embodiments, the largest delay time can include the time it takes the signal to travel the longest distance in free space between the antenna elements 110-1, 110-2, 110-3, 110-4. That is, the largest delay time can include the time it takes the signal to travel in free space between the first antenna element 110-1 that receives the wave front and the antenna element 110-3, which is located the greatest distance from the first antenna element 110-1.

As seen in FIG. 1, the antenna elements 110-1, 110-2, 110-3, 110-4 can be spaced apart from one another at a distance d, for example, on a square grid. That is, the distance between the antenna element 110-1 and the antenna element 110-2 can be d, the distance between the antenna element 110-2 and the antenna element 110-3 can be d, the distance between the antenna element 110-3 and the antenna element 110-4 can be d, and the distance between the antenna element 110-4 and the antenna element 110-1 can be d. Accordingly, the diagonal distance between the antenna element 110-1 and the antenna element 110-3 can be $d\sqrt{2}$, and the diagonal distance between the antenna element 110-2 and the antenna element 110-4 can be $d\sqrt{2}$.

In accordance with the above, a transmission path between adjacent antenna elements can be the length of the diagonal path, $d\sqrt{2}$. Accordingly, the time that it takes the signal to travel between the adjacent antenna elements in free space can be $\Delta t=(d\sqrt{2})/c$, where c is approximately $3\times10^{10}$ cm/second, which is the speed of light in free space.

Therefore, while the fixed length of the transmission path between the antenna element 110-1 and the antenna element 110-2 can be $d\sqrt{2}$, that is, the fixed length of the transmission line 130-1 plus the fixed length of the transmission line 130-2, the variable time that it can take the signal to travel the variable electrical lengths of the transmission line 130-1 and the transmission line 130-2 can be $0\leq\Delta t\leq(d\sqrt{2})/c$. Similarly, while the fixed length of the transmission path between the antenna element 110-2 and the antenna element 110-3 can be $d\sqrt{2}$, that is, the fixed length of the transmission line 130-2 plus the fixed length of the transmission line 130-3, the variable time that it can take the signal to travel the variable electrical lengths of the transmission line 130-2 and the transmission line 130-3 can be $0\leq\Delta t\leq(d\sqrt{2})/c$. While the fixed length of the transmission path between the antenna element 110-3 and the antenna element 110-4 can be $d\sqrt{2}$, that is, the fixed length of the transmission line 130-3 plus the fixed length of the transmission line 130-4, the variable time that it can take the signal to travel the variable electrical lengths of the transmission line 130-3 and the transmission line 130-4 can be $0\leq\Delta t\leq(d\sqrt{2})/c$. While the fixed length of the transmission path between the antenna element 110-4 and the antenna element 110-1 can be $d\sqrt{2}$, that is, the fixed length of the transmission line 130-4 and the fixed length of the transmission line 130-1, the variable time that it can take the signal to travel the variable electrical lengths of the transmission line 130-4 and the transmission line 130-1 can be $0\leq\Delta t\leq(d\sqrt{2})/c$.

The beam former 100 shown in FIG. 1 includes one level. However, the one level shown in FIG. 1 can be nested within additional levels. For example, as seen in FIG. 2, the beam former 200 can include three levels of programmable delay and summation.

In FIG. 2, a transmission line can physically span the distance between and connect a summing node and a level-one beam former. For example, level-one beam formers 100-1, 100-2, 100-3, 100-4 can be connected to a summing node 210-1 by respective transmission lines 220-1, 220-2, 220-3, 220-4. That is, the transmission line 220-1 can connect the summing node 120-1 of the level-one beam former 100-1 to the summing node 210-1, the transmission line 220-2 can connect the summing node 120-2 of the level-one beam former 100-2 to the summing node 210-1, the transmission line 220-3 can connect the summing node 120-3 of the level-one beam former 100-3 to the summing node 210-1, and the transmission line 220-4 can connect the summing node 120-4 of the level-one beam former 100-4 to the summing node 210-1.

Similarly, level-one beam formers 100-5, 100-6, 100-7, 100-8 can be connected to a summing node 210-2 by respective transmission lines 220-5, 220-6, 220-7, 220-8. That is, the transmission line 220-5 can connect the summing node 120-5 of the level-one beam former 100-5 to the summing node 210-2, the transmission line 220-6 can connect the summing node 120-6 of the level-one beam former 100-6 to the summing node 210-2, the transmission line 220-7 can connect the summing node 120-7 of the level-one beam former 100-7 to the summing node 210-2, and the transmission line 220-8 can connect the summing node 120-8 of the level-one beam former 100-8 to the summing node 210-2.

Level-one beam formers 100-9, 100-10, 100-11, 100-12 can also be connected to a summing node 210-3 by respective transmission lines 220-9, 220-10, 220-11, 220-12. That is, the transmission line 220-9 can connect the summing node 120-9 of the level-one beam former 100-9 to the summing node 210-3, the transmission line 220-10 can connect the summing node 120-10 of the level-one beam former 100-10 to the summing node 210-3, the transmission line 220-11 can connect the summing node 120-11 of the level-one beam former 100-11 to the summing node 210-3, and the transmission line 220-12 can connect the summing node 120-12 of the level-one beam former 100-12 to the summing node 210-3.

Finally, level-one beam formers 100-13, 100-14, 100-15, 100-16 can be connected to a summing node 210-4 by respective transmission lines 220-13, 220-14, 220-15, 220-16. That is, the transmission line 220-13 can connect the summing node 120-13 of the level-one beam former 100-13 to the summing node 210-4, the transmission line 220-14 can connect the summing node 120-14 of the level-one beam former 100-14 to the summing node 210-4, the transmission line 220-15 can connect the summing node 120-15 of the level-one beam former 100-15 to the summing node 210-4, and the transmission line 220-16 can connect the summing node 120-16 of the level-one beam former 100-16 to the summing node 210-4.

The physical length of each of the transmission lines 220-1, 220-2, 220-3, 220-4, 220-5, 220-6, 220-7, 220-8, 220-9, 220-10, 220-11, 220-12, 220-13, 220-14, 220-15, 220-16 can be fixed, but the electrical length of each of the transmission lines 220-1, 220-2, 220-3, 220-4, 220-5, 220-6, 220-7, 220-8, 220-9, 220-10, 220-11, 220-12, 220-13, 220-14, 220-15, 220-16 can be programmable and variable. Accordingly, the electrical length of each of the transmission lines 220-1, 220-2, 220-3, 220-4, 220-5, 220-6, 220-7, 220-8, 220-9, 220-10, 220-11, 220-12, 220-13, 220-14, 220-15, 220-16 can provide a range of delay times that spans the time it takes a signal to travel between antenna elements in free space, for example, in air or in a vacuum. In some embodiments, the smallest delay time can include a variable time delay programmable to 0, but still include a fixed delay that is attributable to the physical path length of one of the transmission lines 220-1, 220-2, 220-3, 220-4, 220-5, 220-6, 220-7, 220-8, 220-9, 220-10, 220-11, 220-12, 220-13, 220-14, 220-15, 220-16. In some embodiments, the largest delay time can include the time it takes the signal to travel the longest distance in free space between the antenna elements. That is, the largest delay time can include the time it takes the signal to travel in free space between the antenna element 110-1 in the beam former 100-1 and the antenna element 110-3 in the beam former 100-3.

In FIG. 2, center points or the summing nodes 120-1, 120-2, 120-3, 120-4, 120-5, 120-6, 120-7, 120-8, 120-9, 120-10, 120-11, 120-12, 120-13, 120-14, 120-15, 120-16 of the level-one beam formers 100-1, 100-2, 100-3, 100-4, 100-5, 100-6, 100-7, 100-8, 100-9, 100-10, 100-11, 100-12, 100-13, 100-14, 100-15, 100-16 can be spaced apart from one another at a distance $\lambda$ on a square grid. That is, the distance between the center points of the level-one beam former 100-1 and the center point of the level-one beam former 100-2 can be $\lambda$, the distance between the center point of the level-one beam former 100-2 and the center point of the level-one beam former 100-3 can be $\lambda$, the distance between the center point of the level-one beam former 100-3 and the center point of the level-one beam former 100-4 can be $\lambda$, and the distance between the center point of the level-one beam former 100-4 and the center point of the level-one beam former 100-1 can be $\lambda$. Accordingly, the distance between the center point of the level-one beam former 100-1 and the center point of the level-one beam former 100-3 can be $\lambda\sqrt{2}$, and the distance between the center point of the level-one beam former 100-2 and the center point of the level-one beam former 100-4 can be $\lambda\sqrt{2}$.

Similarly, the distance between the center point of the level-one beam former 100-5 and the center point of the level-one beam former 100-6 can be $\lambda$, the distance between the center point of the level-one beam former 100-6 and the center point of the level-one beam former 100-7 can be $\lambda$, the distance between the center point of the level-one beam former 100-7 and the center point of the level-one beam former 100-8 can be $\lambda$, and the distance between the center point of the level-one beam former 100-8 and the center point of the level-one beam former 100-1 can be $\lambda$. Accordingly, the distance between the center point of the level-one beam former 100-5 and the center point of the level-one beam former 100-7 can be $\lambda\sqrt{2}$, and the distance between the center point of the level-one beam former 100-6 and the center point of the level-one beam former 100-8 can be $\lambda\sqrt{2}$.

The distance between the center point of the level-one beam former 100-9 and the center point of the level-one beam former 100-10 can also be $\lambda$, the distance between the center point of the level-one beam former 100-10 and the center point of the level-one beam former 100-11 can be $\lambda$, the distance between the center point of the level-one beam former 100-11 and the center point of the level-one beam former 100-12 can be $\lambda$, and the distance between the center point of the level-one beam former 100-12 and the center point of the level-one beam former 100-9 can be $\lambda$. Accordingly, the distance between the center point of the level-one beam former 100-9 and the center point of the level-one beam former 100-11 can be $\lambda\sqrt{2}$, and the distance between the center point of the level-one beam former 100-10 and the center point of the level-one beam former 100-12 can be $\lambda\sqrt{2}$.

Finally, the distance between the center point of the level-one beam former 100-13 and the center point of the level-one beam former 100-14 can be $\lambda$, the distance between the center point of the level-one beam former 100-14 and the center point of the level-one beam former 100-15 can be $\lambda$, the distance between the center point of the level-one beam former 100-15 and the center point of the level-one beam former 100-16 can be $\lambda$, and the distance between the center point of the level-one beam former 100-16 and the center point of the level-one beam former 100-13 can be $\lambda$. Accordingly, the distance between the center point of the level-one beam former 100-13 and the center point of the level-one beam former 100-15 can be $\lambda\sqrt{2}$, and the distance between the center point of the level-one beam former 100-14 and the center point of the level-one beam former 100-16 can be $\lambda\sqrt{2}$.

In accordance with the above, a transmission path between related and adjacent level-one beam formers can be the length of the diagonal path, $\lambda\sqrt{2}$. Accordingly, the time that it takes the signal to travel between adjacent antenna elements in free space can be $\Delta t=(\lambda\sqrt{2})/c$, where c is approximately $3\times10^{10}$ cm/second, which is the speed of light in free space. Therefore, while the fixed length of the transmission path between the level-one beam former 100-1 and the level-one beam former 100-2 can be $\lambda\sqrt{2}$, that is, the fixed length of the transmission line 220-1 plus the fixed length of the transmission line 220-2, the variable time that it can take the signal to travel the variable electrical lengths of the transmission line 220-1 and the transmission line 220-2 can be $0\leq\Delta t\leq(\lambda\sqrt{2})/c$. Similarly, while the fixed length of the transmission path between the level-one beam former 100-2 and the level-one beam former 100-3 can be $\lambda\sqrt{2}$, that is, the fixed length of the transmission line 220-2 plus the fixed length of the transmission line 220-3, the variable time that it can take the signal to travel the variable electrical lengths of the transmission line 220-2 and the transmission line 220-3 can be $0 \leq \Delta t \leq (\lambda\sqrt{2})/c$. While the fixed length of the transmission path between the level-one beam former 100-3 and the level-one beam former 100-4 can also be $\lambda\sqrt{2}$, that is, the fixed length of the transmission line 220-3 plus the fixed length of the transmission line 220-4, the variable time that it can take the signal to travel the variable electrical lengths of the transmission line 220-3 and the transmission line 220-4 can also be $0 \leq \Delta t \leq (\lambda\sqrt{2})/c$. While the fixed length of the transmission path between the level-one beam former 100-4 and the level-one beam former 100-1 can be $\lambda\sqrt{2}$, that is, the fixed length of the transmission line 220-4 plus the fixed length of the transmission line 220-1, the variable time that it can take the signal to travel the variable electrical lengths of the transmission line 220-4 and the transmission line 220-1 can be $0 \leq \Delta t \leq (\lambda\sqrt{2})/c$.

Similarly, while the fixed length of the transmission path between the level-one beam former 100-5 and the level-one beam former 100-6 can be $\lambda\sqrt{2}$, that is, the fixed length of the transmission line 220-5 plus the fixed length of the transmission line 220-6, the variable time that it can take the signal to travel the variable electrical lengths of the transmission line 220-5 and the transmission line 220-6 can be $0 \leq \Delta t \leq (\lambda\sqrt{2})/c$. While the fixed length of the transmission path between the level-one beam former 100-6 and the level-one beam former 100-7 can be $\lambda\sqrt{2}$, that is, the fixed length of the transmission line 220-6 plus the fixed length of the transmission line 220-7, the variable time that it can take the signal to travel the variable electrical lengths of the transmission line 220-6 and the transmission line 220-7 can be $0 \leq \Delta t \leq (\lambda\sqrt{2})/c$. While the fixed length of the transmission path between the level-one beam former 100-7 and the level-one beam former 100-8 can also be $\lambda\sqrt{2}$, that is, the fixed length of the transmission line 220-7 plus the fixed length of the transmission line 220-8, the variable time that it can take the signal to travel the variable electrical lengths of the transmission line 220-7 and the transmission line 220-8 can also be $0 \leq \Delta t \leq (\lambda\sqrt{2})/c$. While the fixed length of the transmission path between the level-one beam former 100-8 and the level-one beam former 100-5 can be $\lambda\sqrt{2}$, that is, the fixed length of the transmission line 220-8 plus the fixed length of the transmission line 220-5, the variable time that it can take the signal to travel the variable electrical lengths of the transmission line 220-8 and the transmission line 220-5 can be $0 \leq \Delta t \leq (\lambda\sqrt{2})/c$.

While the fixed length of the transmission path between the level-one beam former 100-9 and the level-one beam former 100-10 can be $\lambda\sqrt{2}$, that is, the fixed length of the transmission line 220-9 plus the fixed length of the transmission line 220-10, the variable time that it can take the signal to travel the variable electrical lengths of the transmission line 220-9 and the transmission line 220-10 can be $0 \leq \Delta t \leq (\lambda\sqrt{2})/c$. Similarly, while the fixed length of the transmission path between the level-one beam former 100-10 and the level-one beam former 100-11 can be $\lambda\sqrt{2}$, that is, the fixed length of the transmission line 220-10 plus the fixed length of the transmission line 220-11, the variable time that it can take the signal to travel the variable electrical lengths of the transmission line 220-10 and the transmission line 220-11 can be $0 \leq \Delta t \leq (\lambda\sqrt{2})/c$. While the fixed length of the transmission path between the level-one beam former 100-11 and the level-one beam former 100-12 can also be $\lambda\sqrt{2}$, that is, the fixed length of the transmission line 220-11 plus the fixed length of the transmission line 220-12, the variable time that it can take the signal to travel the variable electrical lengths of the transmission line 220-11 and the transmission line 220-12 can also be $0 \leq \Delta t \leq (\lambda\sqrt{2})/c$. While the fixed length of the transmission path between the level-one beam former 100-12 and the level-one beam former 100-9 can be $\lambda\sqrt{2}$, that is, the fixed length of the transmission line 220-12 plus the fixed length of the transmission line 220-9, the variable time that it can take the signal to travel the variable electrical lengths of the transmission line 220-12 and the transmission line 220-9 can be $0 \leq \Delta t \leq (\lambda\sqrt{2})/c$.

While the fixed length of the transmission path between the level-one beam former 100-13 and the level-one beam former 100-14 can be $\lambda\sqrt{2}$, that is, the fixed length of the transmission line 220-13 plus the fixed length of the transmission line 220-14, the variable time that it can take the signal to travel the variable electrical lengths of the transmission line 220-13 and the transmission line 220-14 can be $0 \leq \Delta t \leq (\lambda\sqrt{2})/c$. Similarly, while the fixed length of the transmission path between the level-one beam former 100-14 and the level-one beam former 100-15 can be $\lambda\sqrt{2}$, that is, the fixed length of the transmission line 220-14 plus the fixed length of the transmission line 220-15, the variable time that it can take the signal to travel the variable electrical lengths of the transmission line 220-14 and the transmission line 220-15 can be $0 \leq \Delta t \leq (\lambda\sqrt{2})/c$. While the fixed length of the transmission path between the level-one beam former 100-15 and the level-one beam former 100-16 can also be $\lambda\sqrt{2}$, that is, the fixed length of the transmission line 220-15 plus the fixed length of the transmission line 220-16, the variable time that it can take the signal to travel the variable electrical lengths of the transmission line 220-15 and the transmission line 220-16 can also be $0 \leq \Delta t \leq (\lambda\sqrt{2})/c$. While the fixed length of the transmission path between the level-one beam former 100-16 and the level-one beam former 100-13 can be $\lambda\sqrt{2}$, that is, the fixed length of the transmission line 220-16 plus the fixed length of the transmission line 220-13, the variable time that it can take the signal to travel the variable electrical lengths of the transmission line 220-16 and the transmission line 220-13 can be $0 \leq \Delta t \leq (\lambda\sqrt{2})/c$.

As seen in FIG. 2, a transmission line can also physically span the distance between and connect a summing node and a level-two beam former. For example, level-two beam formers 230-1, 230-2, 230-3, 230-4 can be connected to a summing node 240 by respective transmission lines 250-1, 250-2, 250-3, 250-4. That is, the transmission line 250-1 can connect the summing node 210-1 of the level-two beam former 230-1 to the summing node 240, the transmission line 250-2 can connect the summing node 210-2 of the level-two beam former 230-2 to the summing node 240, the transmission line 250-3 can connect the summing node 210-3 of the level-two beam former 230-3 to the summing node 240, and the transmission line 250-4 can connect the summing node 210-4 of the level-two beam former 230-4 to the summing node 240.

The physical length of each of the transmission lines 250-1, 250-2, 250-3, 250-4 can be fixed, but the electrical length of each of the transmission lines 250-1, 250-2, 250-3, 250-4 can be programmable and variable. Accordingly, the electrical length of each of the transmission lines 250-1, 250-2, 250-3, 250-4 can provide a range of delay times that spans the time it takes the signal to travel between the antenna elements in free space, for example in air or in a vacuum. In some embodiments, the smallest delay time can include a variable time delay programmable to 0, but still include a fixed delay that is attributable to the physical path length of one of the transmission lines 250-1, 250-2, 250-3, 250-4. In some embodiments, the largest delay time can include the time it takes the signal to travel the longest distance between the antenna elements. That is, the largest delay time can include the time it takes the signal to travel in free space between the antenna element 110-1 in the beam former 110-1 of the beam former 230-1 and the antenna element 110-3 in the beam former 100-11 of the beam former 230-3, which is located the greatest distance from the antenna element 110-1 in the beam former 110-1 of the beam former 230-1.

In FIG. 2, center points or the summing nodes 210-1, 210-2, 210-3, 210-4 of the level-two beam formers 230-1, 230-2, 230-3, 230-4 can be spaced apart from one another at a distance 2λ on a square grid. That is, the distance between the level-two beam former 230-1 and the level-two beam former 230-2 can be 2λ, the distance between the level-two beam former 230-2 and the level-two beam former 230-3 can be 2λ, the distance between the level-two beam former 230-3 and the level-two beam former 230-4 can be 2λ, and the distance between the level-two beam former 230-4 and the level-two beam former 230-1 can be 2λ. Accordingly, the distance between the level-two beam former 230-1 and the level-two beam former 230-3 can be 2λ√2, and the distance between the level-two beam former 230-2 and the level-two beam former 230-4 can be 2λ√2.

In accordance with the above, the transmission path between adjacent level-two beam formers can be the length of the diagonal path, 2λ√2. Accordingly, the time that it takes the signal to travel between the adjacent antenna elements can be λt=(2λ√2)/c, where c is approximately 3×10$^{10}$ cm/second, which is the speed of light in free space. Therefore, while the fixed length of the transmission path between the level-two beam former 230-1 and the level-two beam former 230-2 can be 2λ√2, that is, the fixed length of the transmission line 250-1 plus the fixed length of the transmission line 250-2, the variable time that it can take the signal to travel the variable electrical lengths of the transmission line 250-1 and the transmission line 250-2 can be 0≤Δt≤(2λ√2)/c. Similarly, while the fixed length of the transmission path between the level-two beam former 230-2 and the level-two beam former 230-3 can be 2λ√2, that is, the fixed length of the transmission line 250-2 plus the fixed length of the transmission line 250-3, the variable time that it can take the signal to travel the variable electrical lengths of the transmission line 250-2 and the transmission line 250-3 can be 0≤Δt≤(2λ√2)/c. While the fixed length of the transmission path between the level-two beam former 230-3 and the level-two beam former 230-4 can also be 2λ√2, that is, the fixed length of the transmission line 250-3 plus the fixed length of the transmission line 250-4, the variable time that it can take the signal to travel the variable electrical lengths of the transmission line 250-3 and the transmission line 250-4 can be 0≤Δt≤(2λ√2)/c. While the fixed length of the transmission path between the level-two beam former 230-4 and the level-two beam former 230-1 can be 2λ√2, that is, the fixed length of the transmission line 250-4 plus the fixed length of the transmission line 250-1, the variable time that it can take the signal to travel the variable electrical lengths of the transmission line 250-4 and the transmission line 250-1 can be 0≤Δt≤(2λ√2)/c.

As seen in FIG. 2, at each higher level, the maximum variable time delay can double. Furthermore, the maximum variable time delay of a higher-level beam former can include the maximum variable time delay of lower-level beam formers combined with the variable time delay in the higher-level beam former transmission lines. As seen in FIG. 2, the antenna elements can be spaced apart from one another at distance d, which is λ/2, the level-one beam formers 100-1, 100-2, 100-3, 100-4, 100-5, 100-6, 100-7, 100-8, 100-9, 100-10, 100-11, 100-12, 100-13, 100-14, 100-15, 100-16 can be spaced apart from one another at a distance λ, and the level-two beam formers 230-1, 230-2, 230-3, 230-4 can be spaced apart from one another at a distance 2λ. In some embodiments, the variable time delay can include a plurality of individual time delays in series. For example, if the maximum variable time delay in a transmission line of one of the level-two beam formers 230-1, 230-2, 230-3, 230-4 can include a plurality of individual time delays in series, the sum of each of the individual time delays in series can still be approximately double the maximum variable time delay of a transmission line in one of the level-one beam formers 100-1, 100-2, 100-3, 100-4, 100-5, 100-6, 100-7, 100-8, 100-9, 100-10, 100-11, 100-12, 100-13, 100-14, 100-15, 100-16.

As also seen in FIG. 2, at each higher level, the physical path length between nodes, that is, between the antenna elements and the summing nodes, can also double. For example, the transmission path between the adjacent antenna elements can be d√2, which is λ/√2, the transmission path between the adjacent level-one beam formers can be λ√2, and the transmission path between the adjacent level-two beam formers can be 2λ√2.

As also seen in FIG. 2, at each higher level, the area in which the transmission lines are placed can quadruple. For example, the transmission lines connecting the antenna elements to a respective one of the summing nodes 120-1, 120-2, 120-3, 120-4, 120-5, 120-6, 120-7, 120-8, 120-9, 120-10, 120-11, 120-12, 120-13, 120-14, 120-15, 120-16 can be in an area that measures 2d, which is λ, the transmission lines 220-1, 220-2, 220-3, 220-4, 220-5, 220-6, 220-7, 220-8, 220-9, 220-10, 220-11, 220-12, 220-13, 220-14, 220-15, 220-16 connecting the level-one beam formers 100-1, 100-2, 100-3, 100-4, 100-5, 100-6, 100-7, 100-8, 100-9, 100-10, 100-11, 100-12, 100-13, 100-14, 100-15, 100-16 to a respective one of the summing nodes 210-1, 210-2, 210-3 can be in an area that measures 4λ, and the transmission lines 250-1, 250-2, 250-3, 250-4 connecting the level-two beam formers 230-1, 230-2, 230-3, 230-4 to the summing node 240 can be in an area that measures 16λ.

In accordance with disclosed embodiments, the scaling between the levels of the nested transmission lines can provide an opportunity to route multiple levels within a single layer of the transmission lines, thus forming a compact, planar array. For example, when the nested transmission lines are scaled in accordance with disclosed embodiments, multiple nest levels can be routed within a single layer of the transmission lines without any of the transmission lines in the single layer crossing another one of the transmission lines in the single layer. In accordance with disclosed embodiments, additional layers can support additional transmission lines and summing nodes to form an arbitrarily large array or sub-array.

It is to be understood that the beam former 200 shown in FIG. 2 is exemplary only. For example, the beam former in accordance with disclosed embodiments can include more or less than three levels. Indeed, the beam former in accordance with disclosed embodiments can include as many levels as would be known and desired by one of ordinary skill in the art.

It is also to be understood that the dashed lines of the level-one beam formers 100-1, 100-2, 100-3, 100-4, 100-5, 100-6, 100-7, 100-8, 100-9, 100-10, 100-11, 100-12, 100-13, 100-14, 100-15, 100-16 and of the level-two beam formers 230-1, 230-2, 230-3, 230-4 shown in FIG. 2 are illustrative only. That is, the dashed lines are not necessarily indicative of any type of boundary, such as a housing. Rather, the dashed lines are intended to show the elements that are included in each referenced beam former.

The transmission lines in accordance with disclosed embodiments, for example, those shown in FIG. 1 and FIG. 2, can include a variable time delay transmission line. For example, in some embodiments, any of the transmission lines can include switches to route a signal path among various fixed lengths of the transmission lines.

Figure 3:
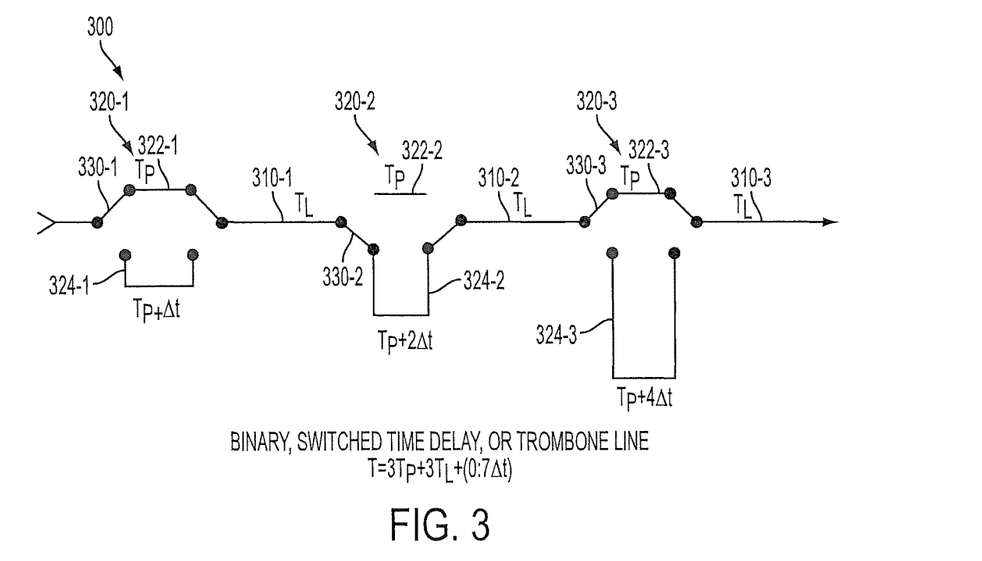
FIG. 3 is a block diagram of a transmission line employing switches in accordance with disclosed embodiments.

FIG. 3 is a block diagram of a transmission line 300 employing switches in accordance with disclosed embodiments and is an example of switching a physical length of the transmission line 300 to vary an electrical length of the transmission line 300. As seen in FIG. 3, the transmission line 300 can include, for example, three fixed stages or paths 310-1, 310-2, 310-3, three switching stages 320-1, 320-2, 320-3, and three switches 330-1, 330-2, 330-3. It is to be understood that the transmission line 300 shown in FIG. 3 is only exemplary and that the transmission line in accordance with disclosed embodiments can include any number of switches and stages, fixed and switching, as would be known and desired by one of ordinary skill in the art.

The time delay of each of the fixed paths 310-1, 310-2, 310-3 can be $T_L$. However, each of the switching stages 320-1, 320-2, 320-3 can include two distinct paths, each of which has a distinct time delay. For example, the switching stage 320-1 can include a path 322-1 and a path 324-1. The path 322-1 can have a time delay of $T_P$, and the path 324-1 can have a time delay of $T_P+\Delta t$, that is, a range of programmable delays from 0 to $\Delta t$. Similarly, the switching stage 320-2 can include a path 322-2 and a path 324-2. The path 322-2 can have a time delay of $T_P$, and the path 324-2 can have a time delay of $T_P+2\Delta t$, that is, a range of programmable delays from 0 to $2\Delta t$. The switching stage 320-3 can include a path 322-3 and a 324-3. The path 322-3 can have a time delay of $T_P$, and the path 324-3 can have a time delay of $T_P+4\Delta t$, that is, a range of programmable delays from 0 to $4\Delta t$.

In the first switching stage 320-1, the switch 330-1 can be flipped to route a signal traversing the transmission line 300 through either the path 322-1 or the path 324-1. Similarly, in the second switching stage 320-2, the switch 330-2 can be flipped to route the signal traversing the transmission line 300 through either the path 322-2 or the path 324-2. In the third switching stage 320-3, the switch 330-3 can be flipped to route the signal traversing the transmission line 300 through either the path 322-3 or the path 324-3. Thus, the total time delay for the transmission line 300 can depend on the switches 330-1, 330-2, 330-2 and the paths 322-1 or 324-1, 322-2 or 324-2, 322-3 or 324-3 along which the signal traversing the transmission line 300 travels. That is, the total time delay T for the transmission line 300 can be $T=3T_P+3T_L+(0:7\Delta t)$. In some embodiments, the variable time delay can be executed in discrete time increments of $\Delta t$.

It is to be understood that embodiments of transmission lines in accordance with disclosed embodiments are not limited to those shown in FIG. 3. For example, a transmission line in accordance with disclosed embodiments can be implemented with the embodiment shown in FIG. 4.

Figure 4:
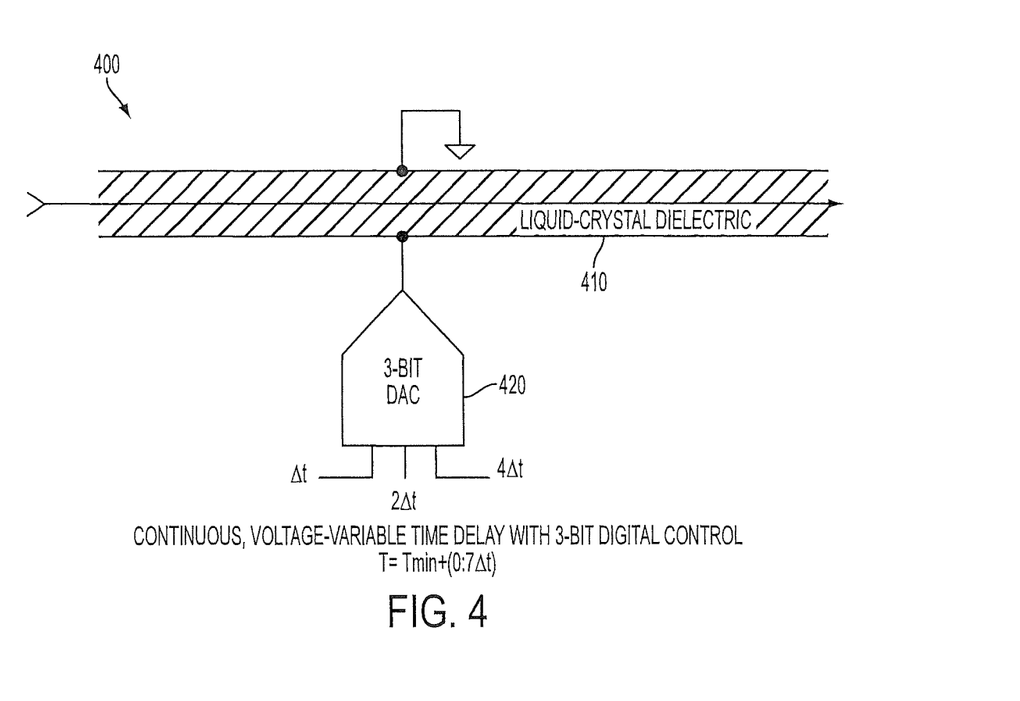
FIG. 4 is a cross-sectional view of a transmission line implemented as a liquid-crystal device in accordance with disclosed embodiments.

As seen in FIG. 4, a programmable and variable time-delay transmission line 400 in accordance with disclosed embodiments can be implemented by varying a dielectric constant of a media in the transmission line through which a signal propagates. In some embodiments, the dielectric constant of the media in the transmission line can be changed by varying an electric potential across the media, and in some embodiments, the media can include a piezoelectric material or a liquid-crystal device ("LCD"). For example, the dielectric constant can be changed in the LCD by varying the electric potential across the LCD over a predetermined range of bias voltage, for example, 5V. In some embodiments, different stages of the transmission line can include respective, different dielectric constants.

In some embodiments, a time delay of the transmission line and a propagation time of the signal propagating through the transmission line can be programmed with the bias voltage. This is not a phase delay. Instead, the signal is time-delayed. For example, in some embodiments, the bias voltage can be dynamically and automatically controlled for continuously varying an absolute level of the bias voltage as a function of time across the LCD during operation of the transmission line and an associated antenna, array, or sub-array, thereby smoothly steering an antenna beam when the associated antenna, array, or sub-array is operating both in the receiving embodiments and in transmitting embodiments. This is an improvement over previously known technology in which the bias voltage is applied to the LCD and adjusted prior to operation of the transmission line and in which the LCD is heated or cooled to freeze the dielectric constant of the media in the transmission line and, accordingly, the time delay of the transmission line at one level during operation of the transmission line. Advantageously, because embodiments disclosed herein dynamically and continuously vary the absolute level of the bias voltage across the LCD during the operation of the transmission line, the time delay of the transmission line can avoid remaining constant for any prolonged predetermined period of time.

In addition to varying the absolute level of the bias voltage across the LCD, in some embodiments, the bias voltage can be modulated at a frequency that prevents such modulation from interfering with the signal propagating through the LCD. For example, in some embodiments, to prevent the bias voltage from unintentionally varying the time delay of the transmission line when the absolute level of the bias voltage is constant, the bias voltage can be modulated from a positive voltage to a negative voltage with equal absolute values ($|+V|=|-V|$). In some embodiments, the frequency of modulation can create sharp edges in a waveform of the bias voltage, and in some embodiments, the frequency of modulation can range from several hundred Hz to as much as 10,000 Hz. Furthermore, in some embodiments, to prevent ion impurities within the LCD from accumulating on bias electrodes, the bias voltage can be modulated to create a periodic positive area (+A) between a positive portion of the waveform and zero and to create a periodic negative area (−A) between a negative portion of the waveform and zero such that the periodic positive area and the periodic negative area have equal absolute values ($|+A|=|-A|$). For example, in some embodiments, each of the periodic positive area and the periodic negative area can be approximately square or trapezoidal.

FIG. 4 is a cross-sectional view the transmission line 400 implemented as a liquid-crystal device in accordance with disclosed embodiments. As explained above, the dielectric constant of the LCD can be changed by varying the electric potential across the LCD.

For example, the transmission line 400 can include a LCD dielectric 410 and a biasing device, for example, a 3-bit digital-to-analog converter ("DAC") 420, to bias the LCD dielectric 410. Although the DAC 420 shown in FIG. 4 includes a 3-bit resolution, it is to be understood that the DAC in accordance with disclosed embodiments could include any resolution as would be known and desired by one of ordinary skill in the art, for example, N bits.

The transmission line 400 can have a minimum time delay of $T_{min}$. However, depending on a selected setting of the DAC 420, the DAC 420 can vary the dielectric constant of the LCD dielectric 410 and cause an additional delay in the transmission line 400 of Δt, 2Δt, and/or 4Δt. Accordingly, the total time delay T for the transmission line 400 can be T=$T_{min}$+(0:7Δt). In some embodiments, such a variable time delay can be continuous and/or analog and infinitely variable, but in some embodiments, the time delay can be executed in steps of Δt.

In some embodiment, the transmission line 300 of FIG. 3 and the transmission line 400 of FIG. 4 can be combined. For example, a hybrid transmission line can form a hybrid time delayer in which one or more portions of the hybrid transmission line can include one or more switches as in FIG. 3 to time-delay the signal traveling through the hybrid transmission line and one or more portions of the hybrid transmission line include the LCD as in FIG. 4 to time-delay the signal traveling through the hybrid transmission line.

In some embodiments, a transmission line as disclosed herein can be implemented as a stripline, a waveguide, or any other buried-structure device as would be known and desired by one of ordinary skill in the art.

In accordance with disclosed embodiments, an ESA antenna can employ programmable time delays to form timed arrays. In some embodiments, such a timed array can include the transmission lines as shown and described herein, for example, the transmission line 300 with the switches at the switching stages as shown in FIG. 3 and/or the transmission line 400 that is LCD-based as shown in FIG. 4.

Figure 5:
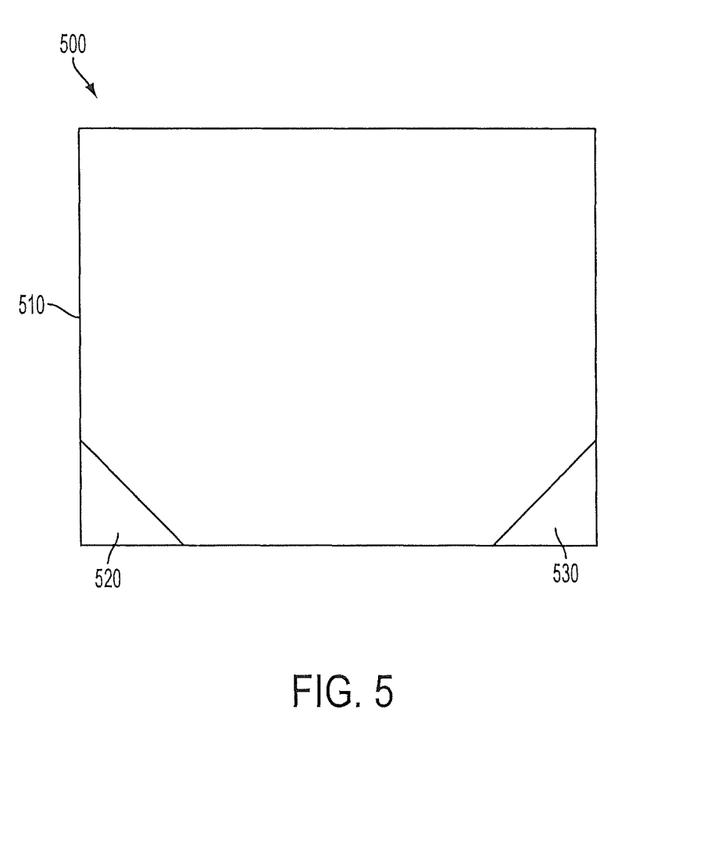
FIG. 5 is a block diagram of a system in accordance with disclosed embodiments.

Any and all of the array antennas, the timed arrays, the sub-arrays and/or the transmission lines shown and described herein can be implemented with the system 500 shown in FIG. 5. For example, the system 500 can include control circuitry 510, one or more programmable processors 520, and executable control software 530 stored on a transitory or non-transitory computer readable medium, including but not limited to a semiconductor memory, such as random access memory ("RAM") or flash memory. In some embodiments, the executable control software 530 can execute steps to vary the electrical lengths of the transmission lines.

Additionally or alternatively, control of any and all of the array antennas, the timed arrays, the sub-arrays and/or the transmission lines shown and described herein can be implemented with an integrated circuit ("IC"). For example, one or more integrated circuits can be embedded in or on an antenna or array layer that is separate from a layer that includes the antenna elements and the beam formers shown and described herein. In some embodiments, the IC can execute steps to vary the electrical lengths of the transmission lines, for example, by controlling voltages to cause time delays.

Although time delays have been shown and described herein, it is to be understood that the principles of the embodiments disclosed herein can also be applied to programmable and variable impedance. For example, when a transmission line includes a programmable time delay, impedance mismatching may occur. Accordingly, embodiments disclosed herein can include a variable and programmable impedance within the transmission line, and the impedance of the transmission line within a beam former can be matched accordingly.

Although a few embodiments have been described in detail above, other modifications are possible. For example, the logic flows described above do not require the particular order described or sequential order to achieve desirable results. Other steps may be provided, steps may be eliminated, from the described flows, and other components may be added to or removed from the described systems. Other embodiments may be within the scope of the invention.

From the foregoing, it will be observed that numerous variations and modifications may be effected without departing from the spirit and scope of the invention. It is to be understood that no limitation with respect to the specific system or method described herein is intended or should be inferred. It is, of course, intended to cover all such modifications as fall within the sprit and scope of the invention.

What is claimed is:

1. A method comprising:
    providing a transmission line that includes a dielectric and a biasing device disposed across the dielectric; and
    varying a time delay of the transmission line by the biasing device dynamically and continuously varying an absolute level of a bias voltage across the dielectric to dynamically and continuously vary a dielectric constant of the dielectric.

2. The method of claim 1 wherein the dielectric includes a liquid-crystal device.

3. The method of claim 1 further comprising the biasing device dynamically and continuously varying the absolute level of the bias voltage across the dielectric during operation of the transmission line.

4. The method of claim 1 further comprising the biasing device dynamically and continuously varying the absolute level of the bias voltage across the dielectric while a signal propagates through the dielectric.

5. The method of claim 1 further comprising:
    varying the dielectric constant to a first value in a first portion of the transmission line; and
    varying the dielectric constant to a second value in a second portion of the transmission line,
    wherein the first value is different than the second value.

6. The method of claim 1 further comprising the biasing device dynamically and continuously varying the absolute level of the bias voltage across the dielectric over a predetermined voltage range.

7. The method of claim 1 further comprising programming the biasing device to automatically control the time delay of the transmission line.

8. The method of claim 1 further comprising the biasing device modulating the bias voltage at a frequency that prevents modulation of the bias voltage from interfering with a signal propagating through the dielectric.

9. The method of claim 8 further comprising the biasing device modulating the bias voltage from a positive voltage to a negative voltage with equal absolute values to prevent the bias voltage from unintentionally varying the time delay of the transmission line when the absolute level of the bias voltage is constant.

10. The method of claim 8 wherein the frequency creates a periodic positive area between a positive portion of a waveform of the bias voltage and zero and creates a periodic negative area between a negative portion of the waveform and zero, and wherein the periodic positive area and the periodic negative area have equal absolute values to prevent ion impurities within the dielectric from accumulating on bias electrodes.

11. A transmission line comprising:
    a dielectric; and
    a biasing device disposed across the dielectric,
    wherein the biasing device dynamically and continuously varies an absolute level of a bias voltage across the dielectric to dynamically and continuously vary a dielectric constant of the dielectric, which varies a time delay of the transmission line.

12. The transmission line of claim 11 wherein the dielectric includes a liquid-crystal device.

13. The transmission line of claim 11 wherein the biasing device dynamically and continuously varies the absolute level of the bias voltage across the dielectric during operation of the transmission line.

14. The transmission line of claim 11 wherein the biasing device dynamically and continuously varies the absolute level of the bias voltage across the dielectric while a signal propagates through the dielectric.

15. The transmission line of claim 11 wherein the dielectric constant is varied to a first value in a first portion of the transmission line, wherein the dielectric constant is varied to a second value in a second portion of the transmission line, and wherein the first value is different than the second value.

16. The transmission line of claim 11 wherein the biasing device dynamically and continuously varies the absolute level of the bias voltage across the dielectric over a predetermined voltage range.

17. The transmission line of claim 11 wherein the biasing device is programmed to automatically control the time delay of the transmission line.

18. The transmission line of claim 11 wherein the biasing device modulates the bias voltage at a frequency that prevents modulation of the bias voltage from interfering with a signal propagating through the dielectric.

19. The transmission line of claim 18 wherein the biasing device modulates the bias voltage from a positive voltage to a negative voltage with equal absolute values to prevent the bias voltage from unintentionally varying the time delay of the transmission line when the absolute level of the bias voltage is constant.

20. The transmission line of claim 11 wherein the frequency creates a periodic positive area between a positive portion of a waveform of the bias voltage and zero and creates a periodic negative area between a negative portion of the waveform and zero, and wherein the periodic positive area and the periodic negative area have equal absolute values to prevent ion impurities within the dielectric from accumulating on bias electrodes.

* * * * *